United States Patent
Murai et al.

(10) Patent No.: US 7,872,274 B2
(45) Date of Patent: Jan. 18, 2011

(54) N-ELECTRODE FOR III GROUP NITRIDE BASED COMPOUND SEMICONDUCTOR ELEMENT

(75) Inventors: Shunsuke Murai, Tokyo (JP); Masanori Murakami, Kyotanabe (JP); Yasuo Koide, Tsukuba (JP); Naoki Shibata, Aichi (JP)

(73) Assignee: Toyoda Gosei Co., Ltd., Nishikasugai-gun, Aichi (JP)

( * ) Notice: Subject to any disclaimer, the term of this patent is extended or adjusted under 35 U.S.C. 154(b) by 0 days.

(21) Appl. No.: 10/415,915

(22) PCT Filed: Sep. 2, 2002

(86) PCT No.: PCT/JP02/08884

§ 371 (c)(1),
(2), (4) Date: May 5, 2003

(87) PCT Pub. No.: WO03/023838

PCT Pub. Date: Mar. 20, 2003

(65) Prior Publication Data

US 2004/0026701 A1    Feb. 12, 2004

(30) Foreign Application Priority Data

Sep. 6, 2001 (JP) .......................... P2001-270960

(51) Int. Cl.
H01L 33/00 (2010.01)
(52) U.S. Cl. .............................. 257/99; 257/13; 257/22; 257/79; 257/103; 257/769

(58) Field of Classification Search ............. 257/12–13, 257/79–82, 87, 98, 99, 102, 103, 763, 769, 257/770, 22; 438/22, 24, 25, 26, 27, 29
See application file for complete search history.

(56) References Cited

U.S. PATENT DOCUMENTS 3,855,610 A * 12/1974 Masuda et al. ............... 257/405

(Continued)

FOREIGN PATENT DOCUMENTS

EP    0622 858 A2    11/1994

(Continued)

OTHER PUBLICATIONS

Electronics Letters. vol. 30, Issue: 11, May 26, 1994, pp. 912-914., "Use of Sn-doped GaAs for non-alloyed ohmic contacts to HEMTs" Ren F.; Cho, A.F.; Sivco, D.L.; Pearton, S.J.; Abernathy, C.R. (published on May 26, 1994).

(Continued)

*Primary Examiner*—Ori Nadav
(74) *Attorney, Agent, or Firm*—McGinn IP Law Group, PLLC

(57) ABSTRACT

An object of the present invention is to obtain greater reduction in resistance between an n-electrode and an n-type layer made of a Group III nitride compound semiconductor. According to the present invention, the n-electrode is formed with a first electrode material made of at least one member selected from the group consisting of vanadium (V), titanium (Ti), zirconium (Zr) and tungsten (W), a second electrode material made of at least one member selected from the group consisting of palladium (Pd), platinum (Pt), gold (Au), silver (Ag) and copper (Cu), and a third electrode material made of at least one member selected from the group consisting of aluminum (Al), silicon (Si) and germanium (Ge).

20 Claims, 3 Drawing Sheets

U.S. PATENT DOCUMENTS

| | | | |
|---|---|---|---|
| 5,397,904 A * | 3/1995 | Arney et al. | 257/66 |
| 5,563,422 A * | 10/1996 | Nakamura et al. | 257/13 |
| 5,580,668 A * | 12/1996 | Kellam | 428/610 |
| 5,679,965 A * | 10/1997 | Schetzina | 257/103 |
| 5,895,225 A * | 4/1999 | Kidoguchi et al. | 438/47 |
| 5,923,052 A * | 7/1999 | Kim | 257/91 |
| 6,072,818 A * | 6/2000 | Hayakawa | 372/46.014 |
| 6,268,618 B1 | 7/2001 | Miki et al. | |
| 6,329,716 B1 * | 12/2001 | Nido et al. | 257/745 |
| 6,417,525 B1 * | 7/2002 | Hata | 257/91 |
| 6,479,889 B1 * | 11/2002 | Yoshida et al. | 257/678 |
| 6,524,976 B2 * | 2/2003 | Takeya | 438/796 |
| 6,563,178 B2 * | 5/2003 | Moriwaki et al. | 257/369 |
| 2001/0006235 A1 | 7/2001 | Ozawa | |
| 2002/0173062 A1 * | 11/2002 | Chen et al. | 438/30 |

FOREIGN PATENT DOCUMENTS

| | | |
|---|---|---|
| JP | 62-287675 | 12/1987 |
| JP | 03-183173 | 8/1991 |
| JP | 05-129658 | 5/1993 |
| JP | 05-211347 | 8/1993 |
| JP | 07-221103 | 8/1995 |
| JP | 09-069623 | 3/1997 |
| JP | 10-022494 | 1/1998 |
| JP | 10-200161 | 7/1998 |
| JP | 10-247746 | 9/1998 |
| JP | 10-308534 | 11/1998 |
| JP | 11-008410 | 1/1999 |
| JP | 2000-164967 | 6/2000 |
| JP | 2000-286457 | 10/2000 |
| JP | 2000-294768 | 10/2000 |
| JP | 2001-85750 | 3/2001 |
| JP | 2001-196574 | 7/2001 |

OTHER PUBLICATIONS

European search report dated Sep. 27, 2005.
Very low resistance multilayer Ohmic contact to n-GaN Applied Physics Letters, American Institute of Physics. New York, US, vol. 68, No. 12, Mar. 18, 1996, pp. ISSN: 0003-6951.

* cited by examiner

COMPARISON BETWEEN Ti/Al AND Ti/Pd/Al

HEAT TREATMENT TEMPERATURE (°C)
COMPARISON BETWEEN Ti/Al AND Ti/Pt/Al

N-ELECTRODE FOR III GROUP NITRIDE BASED COMPOUND SEMICONDUCTOR ELEMENT

TECHNICAL FIELD

The present invention relates to an n-electrode for a Group III nitride compound semiconductor device.

BACKGROUND ART

Heretofore, an n-electrode formed on an n-type layer in a Group III nitride compound semiconductor device such as a blue light-emitting diode has been improved variously to secure ohmic contact between the n-electrode and the n-type layer. An n-electrode introduced in JP-A-11-8410 includes a first electrode material made of at least one member selected from the group consisting of titanium, zirconium and tungsten, a second electrode material made of at least one member selected from the group consisting of aluminum, silicon and germanium, and a third electrode material made of rhodium.

At present, greater improvement in output and efficiency is required of a light-emitting device. From this point of view, there is a demand for greater reduction in resistance between the n-electrode and the n-type layer of a Group III nitride compound semiconductor.

Also when Group III nitride compound semiconductors are applied to other devices than the light-emitting device, resistance between the n-type Group III nitride compound semiconductor and the electrode needs to be sufficiently low. For example, an n-AlGaN/GaN type HFET (Hetero Junction Field Effect Transistor) is noticed as a next-generation power high-frequency device. A low-resistance ohmic contact material exhibiting a sufficiently low contact resistance value in contact with n-$Al_xGa_{1-x}N$ ($x>0.2$) and stable to heat is required for making this device fit for practical use. In the case of a Ti/Al type contact material used for n-GaN at present, the contact resistance value of the contact material increases as the Al content of n-AlGaN increases.

DISCLOSURE OF THE INVENTION

As the fruit of the inventors' eager examination to solve the aforementioned problem, there has been found the following invention. That is, an n-electrode for a Group III nitride compound semiconductor device, including:

a first electrode material made of at least one member selected from the group consisting of vanadium (V), titanium (Ti), zirconium (Zr) and tungsten (W);

a second electrode material made of at least one member selected from the group consisting of palladium (Pd), platinum (Pt), gold (Au), silver (Ag) and copper (Cu); and a third electrode material made of at least one member selected from the group consisting of aluminum (Al), silicon (Si) and germanium (Ge).

According to the n-electrode of the present invention, the combination of the aforementioned electrode materials, especially, the use of the second electrode material, makes contact resistance between the n-type layer of a Group III nitride compound semiconductor and the electrode lower than that in a conventional example.

In the above description, vanadium or titanium is preferably used as the first electrode material from the point of view of heat stability. Palladium is preferably used as the second electrode material from the point of view of obtaining lower contact resistance (see FIG. 1). Aluminum is preferably used as the third electrode material from the point of view of material cost.

The n-electrode according to the present invention may contain a fourth electrode material. For example, gold (Au), rhodium (Rh), etc. may be used as the fourth metal component.

For example, the n-electrode according to the present invention is formed by laminating layers of the first to third electrode materials on the n-type layer and heating these layers. Alternatively, an alloy formed from a plurality of electrode materials selected from the first to third electrode materials in advance may be laminated on the n-type layer. Each kind of the electrode material layers may be laminated as a plurality of layers. For example, the respective electrode material layers may be laminated so that a first electrode material layer, a second electrode material layer, a third electrode material layer and a first electrode material layer are arranged in that order.

A plurality of metal materials may be used as the first, second or third electrode material itself. In this case, one electrode material layer may be made of an alloy of the plurality of metal materials or may be made of a laminate of the plurality of metal materials. In the latter case, for example, two kinds of metal layers constituting the first electrode material may be made to exist so that the second electrode material layer is sandwiched between the two kinds of metal layers.

A method for laminating the respective electrode materials on the n-type layer is not particularly limited. For example, a method such as vapor deposition, sputtering or the like can be used.

A sequence of lamination of the respective electrode material layers is not particularly limited but it is preferable from the point of view of heat stability, etc. that the first electrode material layer, the second electrode material layer and the third electrode material layer are formed in that order viewed from the n-type layer side.

Heating is performed for forming ohmic contact between the electrode materials and the n-type layer. The respective electrode materials are harmoniously integrally alloyed by the heating.

Preferably, the heating is performed at an atmospheric pressure and in an atmosphere of inert gas. Nitrogen gas, helium gas, argon gas, or the like, can be used as the inert gas. This is the case where safety is considered. From the point of view of electrode characteristic, hydrogen gas, or the like, may be also used.

The heating temperature and heating time are selected suitably according to the material for forming the n-type layer, the electrode materials used and the film thickness thereof.

Incidentally, in this description, each of Group III nitride compound semiconductors is represented by the general formula:

$Al_XGa_YIn_{1-X-Y}N$ ($0 \leq X \leq 1, 0 \leq Y \leq 1, 0 \leq X+Y \leq 1$)

which includes so-called binary compounds such as AlN, GaN and InN, and so-called ternary compounds such as $Al_xGa_{1-x}N$, $Al_xIn_{1-x}N$ and $Ga_xIn_{1-x}N$ ($0<x<1$ each).

The group III elements may be at least partially replaced by boron (B), thallium (Tl), or the like. The nitrogen (N) may be at least partially replaced by phosphorus (P), arsenic (As), antimony (Sb), bismuth (Bi), or the like. Each of the group III nitride compound semiconductor layers may contain an optional dopant. Si, Ge, Se, Te, C, or the like, can be used as n-type impurities. Mg, Zn, Be, Ca, Sr, Ba, or the like, can be used as p-type impurities. Incidentally, after doped with p-type impurities, the Group III nitride compound semiconductor may be subjected to electron beam irradiation, plasma irradiation or heating in a furnace but this treatment is not essential. The method of forming each group III nitride compound semiconductor layer is not particularly limited. Besides a metal organic chemical vapor deposition method (MOCVD method), the group III nitride compound semiconductor layer can be formed by a known method such as a molecular beam epitaxy method (MBE method), a halide vapor phase epitaxy method (HVPE method), a sputtering method, an ion-plating method, an electron showering method, etc.

Incidentally, a homo structure or a single or double hetero structure may be used as the structure of the light-emitting device. A quantum well structure (single quantum well structure or multiple quantum well structure) may be also used.

BEST MODE FOR CARRYING OUT THE INVENTION

Experimental Examples of the present invention will be described below.

Embodiment 1

Figure 1:
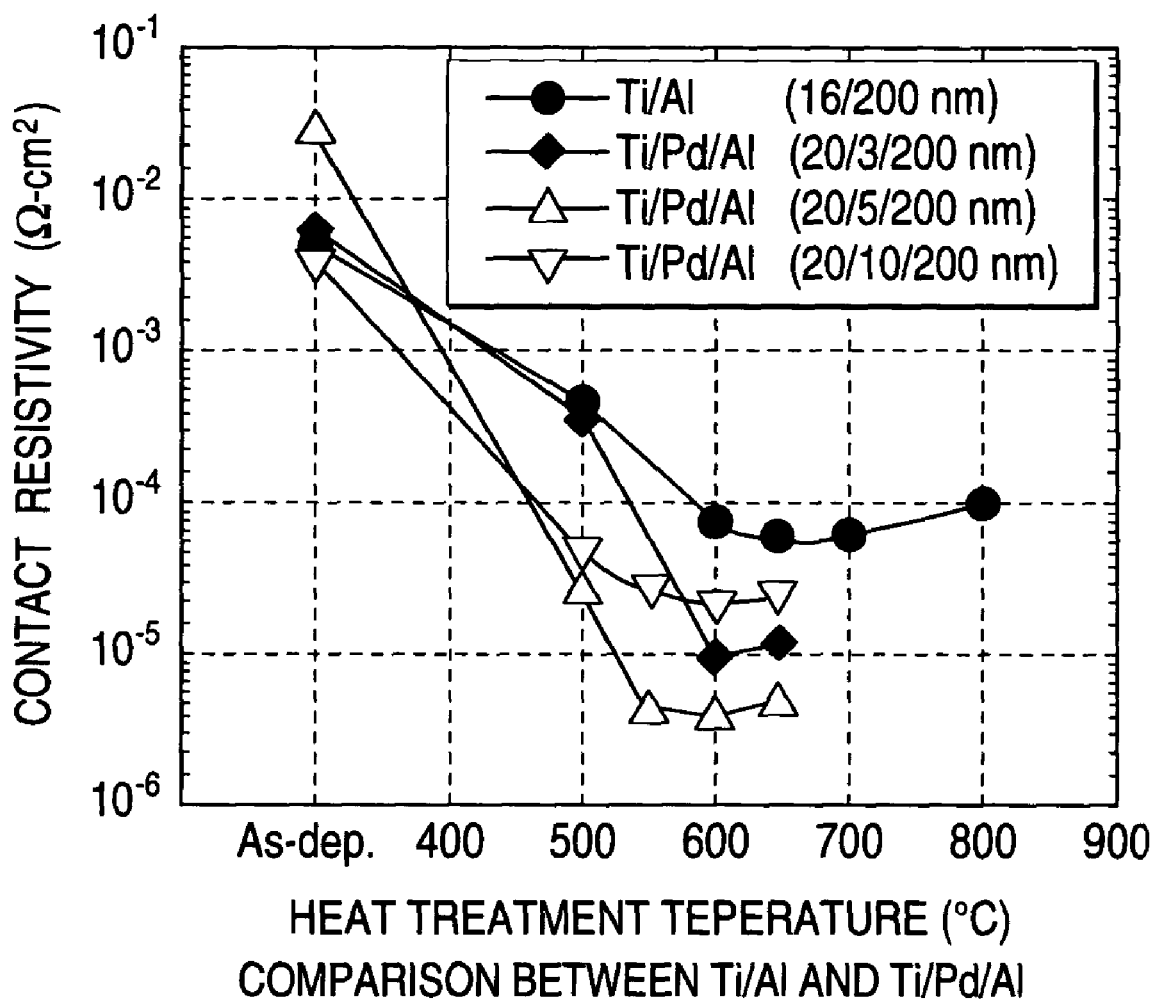
FIG. 1 is a graph showing contact resistance of an n-electrode (Ti/Pd/Al) according to an embodiment of the present invention.
Figure 2:
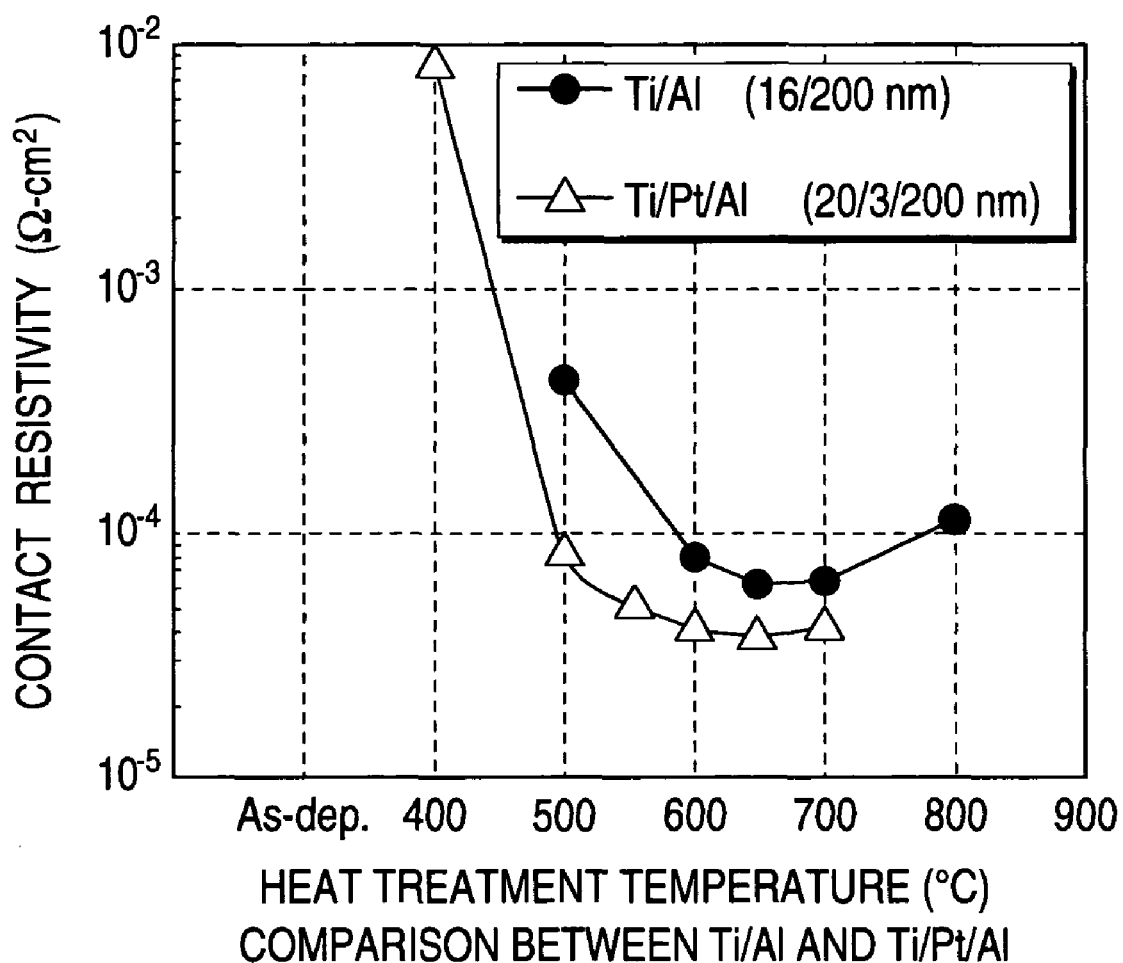
FIG. 2 is a graph showing contact resistance of an n-electrode (Ti/Pt/Al) according to another embodiment.

An AlN buffer layer (0.02 μm), a GaN layer (2.0 μm) and Si-doped n-$Al_{0.2}Ga_{0.8}N$ ($N_d=2\times10^{18}$ $cm^{-3}$) were grown on a sapphire substrate successively by an MOCVD method, so that an HEMT structure was used. Ti/Pd/Al (film thickness nm: 20/3, 5, 10/200) and Ti/Pt/Al (film thickness nm: 20/5/200) were deposited on the HEMT structure respectively from a semiconductor interface to prepare two kinds of samples. Each of the two kinds of samples was heated in a nitrogen gas atmosphere for 30 seconds by RTA (Rapid Thermal Annealing). Then, contact resistance values of the two kinds of samples were measured by a Marlow-Das type TLM method. Results are shown in FIGS. 1 and 2. Incidentally, the results shown in FIGS. 1 and 2 are expressed in arithmetic averages of measured results at respective heating temperatures.

A comparative example expressed by black dots in the results shown in FIG. 1 was the case where an electrode of Ti/Al (film thickness nm: 16/200) was used. The contact resistance value of Ti/Al was $\rho_c=5.9\times10^{-5}$ ($\Omega$-$cm^2$). In comparison with this contact resistance value, the contact resistance value of Ti/Pd/Al in all examples showing the case where Pd was added to Ti/Al was lower by about one figure. Particularly when the film thickness of Pd was 5 nm, the lowest value $\rho_c=4.1\times10^{-6}$ ($\Omega$-$cm^2$) was exhibited.

It is obvious from the above description that the preferred electrode formed on an AlGaN layer in an n-type AlGaN/GaN hetero structure is Ti/Pt/Al and that the film thickness ratio is preferably Ti:Pt:Al=10:1-10:100, more preferably 10:1-2:100. It is also obvious that the heating temperature is preferably in a range of from 500° C. to 700° C., more preferably in a range of from 550° C. to 650° C.

In the results shown in FIG. 2, the contact resistance value of Ti/Pt/Al in the embodiment showing the case where Pt was added was lower than that of Ti/Al (film thickness nm: 16/200) in the comparative example expressed by black dots, that is, the contact resistance value of Ti/Pt/Al was $\rho_c=3.8\times10^{-5}$ ($\Omega$-$cm^2$).

It is obvious from the above description that the preferred electrode formed on an AlGaN layer in an n-type AlGaN/GaN hetero structure is Ti/Pt/Al and that the film thickness ratio is preferably Ti:Pd:Al=10:1-10:100, more preferably 10:1-2:100. It is also obvious that the heating temperature is preferably in a range of from 500° C. to 700° C., more preferably in a range of from 550° C. to 650° C.

From these results, the presence of a Pd—Ga compound is conceivable. From these results, the following fact is conceivable. First, a metal such as Pd highly reactive to Ga is chemically combined with Ga in the n-type layer to thereby produce a Ga-vacancy in the n-type layer. Inactive Si enters the Ga-vacancy and acts as a donor. As a result, the donor concentration increases, so that reduction in contact resistance is obtained. In addition, when Si does not enter the Ga-vacancy, it is conceived that the effect of reducing the contact resistance can be also obtained because the Ga-vacancy per se has a function of accelerating the formation of n-type semiconductor.

With respect to deterioration, the contact resistance of the Ti/Pd/Al electrode was measured in the same manner as described above after the Ti/Pd/Al electrode was left at room temperature for 4000 hours or more. Results substantially equal to those shown in FIG. 1 were also obtained in this case.

It is a matter of course that the materials of the substrate and the buffer layer are not limited if an n-type AlGaN/GaN HEMT structure can be obtained. Besides n-type AlGaN/GaN, n-type AlGaN/AlGaN, n-type GaN/InGaN and n-type InGaN/InGaN may be used. A good result can be obtained even in the case where the Ti/Pd/Al or Ti/Pt/Al electrode is applied to n-type GaN or n-type InGaN as well as the Ti/Pd/Al or Ti/Pt/Al electrode is applied to n-type AlGaN.

The fact that Zr and W as well as Ti can be used as the first metal material has been described in JP-A-11-8410. The fact that Si and Ge as well as Al can be used as the third metal material has been also described in JP-A-11-8410.

Embodiment 2

There was formed an HEMT structure the same as in Embodiment 1 except that Ti was replaced by vanadium (V). The electrode was formed by a vapor deposition method. The heat treatment was RTA in the same condition as in Embodiment 1.

Although the contact resistance was $6\times10^{-6}$ ($\Omega$-$cm^2$) when V/Al was used, contact resistance values of $5\times10^{-6}$ ($\Omega$-$cm^2$) and $5.5\times10^{-6}$ ($\Omega$-$cm^2$) were obtained in V/Pd/Al (film thickness nm: 20/5/200) and V/Pt/Al (film thickness nm: 20/3/200) respectively.

In this case, the heat treatment temperature is preferably in a range of from 500° C. to 700° C.

Embodiment 3

The embodiment of the present invention will be described below.

Figure 3:
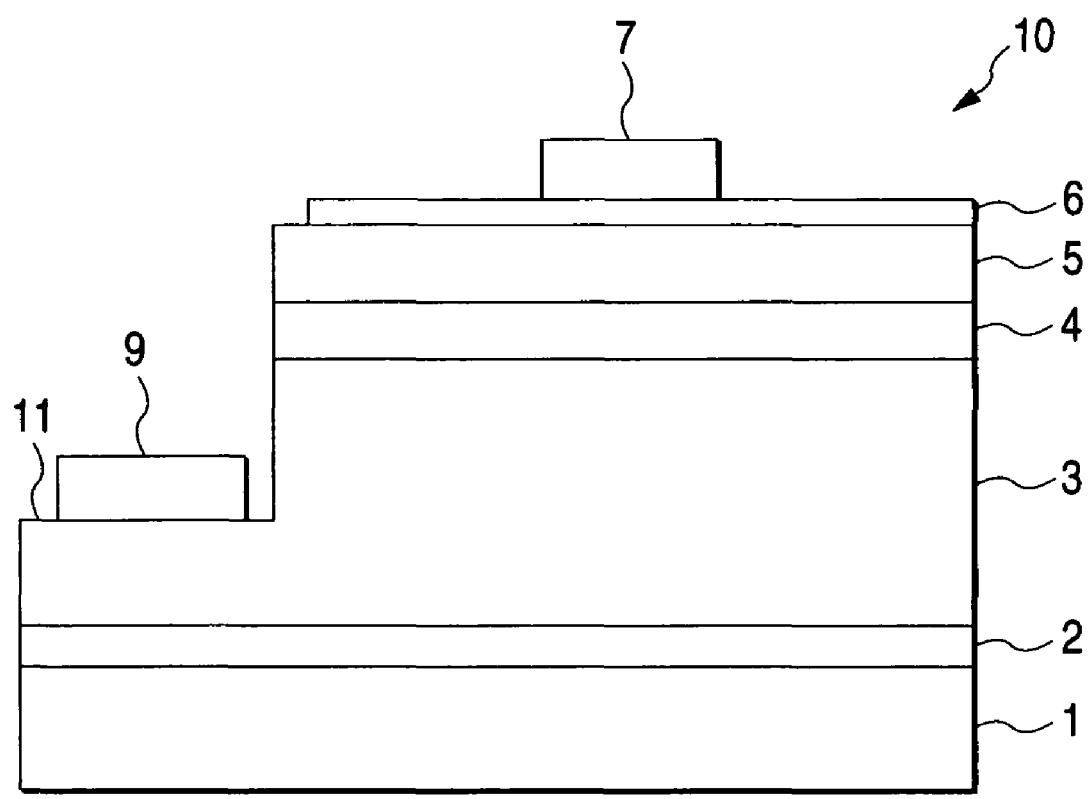
FIG. 3 is a sectional view showing the configuration of the light-emitting device according to the embodiment.

First, semiconductor layers were laminated to form a configuration shown in FIG. 3.

| Layer | Composition |
| --- | --- |
| p-type layer 5 | p-GaN:Mg |
| Layer 4 containing a light-emitting layer | layer containing InGaN layer |
| n-type layer 3 | n-GaN:Si |
| Buffer layer 2 | AlN |
| Substrate 1 | sapphire |

An n-type layer 3 of GaN doped with Si as n-type impurities was formed on a substrate 1 through a buffer layer 2. Although the case where sapphire is used as the substrate 1 is shown above, the substrate 1 is not limited thereto. Sapphire, spinel, silicon, silicon carbide, zinc oxide, gallium phosphide, gallium arsenide, magnesium oxide, manganese oxide, group III nitride compound semiconductor single crystal, or the like, may be used. Although the buffer layer is made of AlN by an MOCVD method, the buffer layer is not limited thereto. GaN, InN, AlGaN, InGaN, AlInGaN, or the like, may be used as the material of the buffer layer. A molecular beam epitaxy method (MBE method), a halide vapor phase epitaxy method (HVPE method), a sputtering method, an ion-plating method, an electron showering method, or the like, may be used as the method for forming the buffer layer. When, for example, GaN is used as the substrate, the buffer layer can be dispensed with.

As occasion demands, the substrate and the buffer layer may be removed after the formation of the semiconductor device.

Although the case where the n-type layer is made of GaN is shown above, AlGaN, InGaN or AlInGaN may be used.

Although the case where the n-type layer is doped with Si as n-type impurities is shown above, other n-type impurities such as Ge, Se, Te, C, etc. may be used.

The n-type layer 3 may be of a two-layered structure having an n− layer of low electron concentration on the side of the layer 4 containing a light-emitting layer and an n+ layer of high electron concentration on the buffer layer 2 side.

The layer 4 containing a light-emitting layer may contain a light-emitting layer of a quantum well structure. The structure of the light-emitting device may be of a single hetero type, a double hetero type or a homo junction type.

The layer 4 containing a light-emitting layer may contain a Group III nitride compound semiconductor layer doped with an acceptor such as magnesium on the p-type layer 5 side and having a wide band gap. This is made for effectively preventing electrons injected into the layer 4 containing a light-emitting layer from diffusing into the p-type layer 5.

A p-type layer 5 of GaN doped with Mg as p-type impurities was formed on the layer 4 containing a light-emitting layer. As the material of the p-type layer, AlGaN, InGaN or InAlGaN may be used alternatively. As the p-type impurities, Zn, Be, Ca, Sr or Ba may be used alternatively.

Further, the p-type layer 5 may be of a two-layered structure having a p− layer of low hole concentration on the side of the layer 4 containing a light-emitting layer and a p+ layer of high hole concentration on the electrode side.

In the light-emitting diode configured as described above, each of the Group III nitride compound semiconductor layers can be formed by executing MOCVD in a general condition or formed by a method such as a molecular beam epitaxy method (MBE method), a halide vapor phase epitaxy method (HVPE method), a sputtering method, an ion-plating method, an electron showering method, etc.

Then, a mask was formed and the p-type layer 5, the layer 4 containing a light-emitting layer and the n-type layer 3 were partially removed by reactive ion etching to reveal an n-electrode-forming surface 11 on which an n-electrode 9 would be formed. Then, a Co layer (1.5 nm) and an Au layer (60 nm) as layers for forming a translucent electrode 6 were successively laminated on the whole surface of the wafer by an evaporation apparatus. Then, a Cr layer (30 nm), an Au layer (1.5 μm) and an Al layer (10 nm) were successively vapor-deposited and laminated by a lift-off method to laminate layers for forming a p-seat electrode 7.

Then, a Ti layer (20 nm), a Pd layer (5 nm) and an Al layer (200 nm) were successively laminated by a lift-off method to form layers for forming the n-electrode 9.

The sample obtained in the aforementioned manner was heated at 600° C. for 30 seconds at an atmospheric pressure and in a nitrogen atmosphere. Then, the wafer was cut into chips by a dicing process. In this manner, a light-emitting diode 10 according to the embodiment was obtained. A voltage of not higher than 3.2 V at 20 mA was obtained in the light-emitting diode 10, so that the light-emitting diode 10 was good. A good result was also obtained even in the case where Ti/Pd/Al was replaced by Ti/Pt/Al, V/Pd/Al or V/Pt/Al.

Although the present invention has been described in detail and with reference to specific embodiments, it is obvious to those skilled in the art that various changes and modifications may be made without departing from the spirit and scope of the present invention.

This application is based on Japanese Patent Application (Japanese Patent Application 2001-270960) filed on Sep. 6, 2001, the entirety of which is incorporated herein by reference.

Industrial Applicability

The present invention is not limited to the description of the embodiments of the present invention at all. Various modifications which can be easily conceived by those skilled in the art may be contained in the present invention without departing from the description of the scope of claim. It is also a matter of course that the present invention can be applied to a laser diode, an acceptance device, an electronic device and another Group III nitride compound semiconductor device than the light-emitting device.

The following items are disclosed.

11. An n-electrode obtained by heating a first electrode material layer of at least one member selected from the group consisting of vanadium (V), titanium (Ti), zirconium (Zr) and tungsten (W), a second electrode material layer of at least one member selected from the group consisting of palladium (Pd), platinum (Pt), gold (Au), silver (Ag) and copper (Cu), and a third electrode material layer of at least one member selected from the group consisting of aluminum (Al), silicon (Si) and germanium (Ge), laminated on an n-type layer.

12. An n-electrode according to the item 11, characterized in that the first electrode material layer is formed on the n-type layer, the second electrode material layer is formed on the first electrode material layer, and the third electrode material layer is formed on the second electrode material layer.

13. An n-electrode according to the item 11 or 12, characterized in that the heating is carried out in an atmosphere of inert gas at a heating temperature of 500° C. to 700° C.

14. An n-electrode according to the item 13, characterized in that the inert gas is nitrogen gas and the heating temperature is in a range of from 550° C. to 650° C.

15. An n-electrode according to any one of the items 11 through 14, characterized in that the first electrode material layer, the second electrode material layer and the third electrode material layer have a film thickness ratio of 10:1-10:100.

16. A Group III nitride compound semiconductor device characterized in that the device has an n-electrode according to any one of the items 11 through 15.

The invention claimed is:

1. A semiconductor device, comprising:
   a substrate; and
   a Group III nitride compound semiconductor device formed on said substrate, said Group III nitride compound semiconductor device comprising:
   an n-type layer; and
   an n-electrode formed on said n-type layer for making an ohmic contact therewith, said n-electrode comprising:
   a first electrode material including at least one member selected from the group consisting of vanadium, zirconium and tungsten;
   a second electrode material including at least one member selected from the group consisting of palladium, platinum, silver and copper; and
   a third electrode material including at least one member selected from the group consisting of aluminum, silicon and germanium,
   wherein the first electrode material is formed directly on said n-type layer of said Group III nitride compound semiconductor device,
   wherein the second electrode material is disposed directly on the first electrode material, and
   wherein the third electrode material is disposed directly on the second electrode material,
   a film thickness ratio of said first, second, and third electrode materials being preset as based on a low desired contact resistance value for said n-electrode.

2. The semiconductor device according to claim 1, wherein said first electrode material includes at least vanadium, and wherein said third electrode material includes aluminum.

3. The semiconductor device according to claim 1, wherein said n-type layer includes at least one of GaN, GaInN and AlGaN.

4. The semiconductor device according to claim 1, further comprising a fourth electrode material including at least one of gold and rhodium.

5. The semiconductor device according to claim 1,
   wherein the second electrode material includes palladium; and
   wherein the third electrode material includes aluminum.

6. The semiconductor device according to claim 1,
   wherein the second electrode material includes platinum; and
   wherein the third electrode material includes aluminum.

7. The semiconductor device of claim 1, wherein said Group III nitride compound semiconductor device comprises a light emitting device.

8. The semiconductor device of claim 7, wherein said n-type layer comprises GaN doped with Si.

9. The semiconductor device of claim 7, wherein said n-type layer comprises one of GaN; AlGaN; InGaN; and AlInGaN.

10. The semiconductor device of claim 9, wherein a dopant used in forming said n-type layer comprises at least one of: Si; Ge; Se; Te; and C.

11. A semiconductor device, comprising:
    a substrate; and
    a Group III nitride compound semiconductor device formed on said substrate, said Group III nitride compound semiconductor device comprising:
    an n-type layer; and
    an n-electrode formed directly on said n-type layer for making an ohmic contact therewith, said n-electrode comprising:
    a first electrode layer formed on an n-type layer of said Group III nitride compound semiconductor device and including at least one of vanadium, zirconium and tungsten;
    a second electrode layer formed on said first electrode layer, and including at least one of palladium, platinum, silver and copper; and
    a third electrode layer formed on said second electrode layer, and including at least one of aluminum, silicon and germanium,
    a film thickness ratio of said first, second, and third electrode layers preset, based on a desired low contact resistance value for said n-electrode.

12. The semiconductor device according to claim 11, wherein the second electrode layer is disposed directly on the first electrode layer.

13. The semiconductor device according to claim 11, wherein the third electrode layer is disposed directly on the second electrode layer.

14. The semiconductor device according to claim 11,
    wherein the second electrode layer includes palladium; and
    wherein the third electrode layer includes aluminum.

15. The semiconductor device according to claim 11,
    wherein the second electrode layer includes platinum; and
    wherein the third electrode layer includes aluminum.

16. The semiconductor device according to claim 11, wherein said n-type layer includes at least one of GaN, GaInN and AlGaN.

17. The semiconductor device according to claim 14, wherein said film thickness ratio of X:Pd:Al substantially equals 10:1-10:100, where X is the first electrode layer material.

18. The semiconductor device according to claim 14, wherein said film thickness ratio of X:Pd:Al substantially equals 10:2-3:100, where X is the first electrode layer material.

19. The semiconductor device according to claim 14, wherein said film thickness ratio of X:Pt:Al substantially equals 10:1-10:100, where X is the first electrode layer material.

20. The semiconductor device according to claim 14, wherein said film thickness ratio of X:Pt:Al substantially equals 10:1-2:100, where X is the first electrode layer material.

* * * * *